United States Patent
Lam et al.

(10) Patent No.: US 6,417,014 B1
(45) Date of Patent: *Jul. 9, 2002

(54) METHOD AND APPARATUS FOR REDUCING WAFER TO WAFER DEPOSITION VARIATION

(75) Inventors: Kin-Sang Lam; Sey-Ping Sun, both of Austin, TX (US)

(73) Assignee: Advanced Micro Devices, Inc., Austin, TX (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/421,184

(22) Filed: Oct. 19, 1999

(51) Int. Cl.[7] .......................... G01R 31/26; H01L 21/66
(52) U.S. Cl. ...................... 438/14; 438/680; 438/778; 427/255.11; 427/255.21; 118/718; 118/719; 414/217; 414/222; 414/935
(58) Field of Search .......................... 438/14, 680, 778; 427/255.11, 255.21; 118/679, 697, 718, 719; 414/217, 222, 935, 937

(56) References Cited

U.S. PATENT DOCUMENTS

| | | | | |
|---|---|---|---|---|
| 5,494,494 A | * | 2/1996 | Mizuno et al. | 29/25.01 |
| 5,512,320 A | * | 4/1996 | Turner et al. | 427/255 |
| 5,943,230 A | * | 8/1999 | Rinnen et al. | 364/147 |

* cited by examiner

Primary Examiner—Wael Fahmy
Assistant Examiner—Hsien-Ming Lee
(74) Attorney, Agent, or Firm—Williams, Mason & Amerson, P.C.

(57) ABSTRACT

A processing line includes a processing tool and an automatic process controller. The processing tool is adapted to deposit a layer of material on a semiconductor wafer based on an operating recipe. The automatic process controller is adapted to identify a post-idle set of wafers to be processed in the processing tool after an idle period, determine deposition times for wafers in the set of post-idle wafers, and modify the operating recipe of the processing tool for each of the wafers in the post-idle set based on the deposition times. A method for reducing wafer to wafer deposition variation includes designating a set of post-idle wafers; determining a deposition time for each of the wafers in the post-idle set, at least two of the deposition times being different; and depositing a layer on the wafers in the post-idle set based on the deposition times determined.

18 Claims, 2 Drawing Sheets

METHOD AND APPARATUS FOR REDUCING WAFER TO WAFER DEPOSITION VARIATION

BACKGROUND OF THE INVENTION

1. Field of the Invention

This invention relates generally to semiconductor device manufacturing, and more particularly, to a method and apparatus for reducing wafer to wafer deposition variation.

2. Description of the Related Art

In the manufacture of semiconductor devices, wafers, such as silicon wafers, are subjected to a number of processing steps. The processing steps include depositing or forming layers, patterning the layers, and removing portions of the layers to define features on the wafer. One such process step is the formation of a layer by chemical vapor deposition (CVD), where reactive gases are introduced into a vessel, e.g. a CVD tool, containing the semiconductor wafers. The reactive gases facilitate a chemical reaction that causes a layer to form on the wafers.

As the CVD tool is used repeatedly, material builds up on the internal surfaces of the tool, eventually affecting the deposition rate. Preventative maintenance procedures are performed periodically to remove this buildup and stabilize the deposition rate. The CVD tool is subject to numerous idle times, including the times preventative maintenance is performed, where the temperature of the tool is maintained at a level significantly less than its operating temperature. Other reasons for idle time include periodic testing or calibration and delays caused by other tools (not shown) upstream in the processing line.

In one illustrative CVD tool, the tool includes a heating block for maintaining the temperature of the tool during processing in accordance with a predetermined recipe, and a gas inlet for introducing reactive gases into the vessel. When the tool is brought back into service after an idle period, there is inherent variability in the deposition rate of the tool due to changes in the thermal characteristics of the tool. This variability exists until the tool has been operating for a period of time under steady state conditions. Generally, the heating lock is a large plate of aluminum, having a considerable thermal mass. The temperature of the gas inlet, often referred to as the shower head, and the emissivity of the wafer also affect the deposition rate during the initial start up.

A known technique for addressing this variability includes changing the temperature parameters (e.g., starting temperature and temperature ramp rate) in the recipe of the tool during the ramp up period. Changing the temperature affects the deposition rate, thus trying to compensate for the deposition rate variation during the ramp up period. Measurements of the deposition thickness are taken for each wafer and the temperature parameters are manually changed in response to the thickness feedback for subsequent wafers. If the thickness of the deposited wafer is not within tolerances, the wafer is re-worked (e.g., polished if too thick or subjected to another deposition if too thin). This rework is costly because it ties up the tools necessary for the rework to process only a limited number of wafers.

Adjusting the temperature, as described above, has precision limitations. First, the large thermal mass of the tool causes stability problems for the changing temperatures. Second, typical thermocouples used for controlling the temperature of the tool have an accuracy of ×3 or 4 degrees Celsius. The temperature adjustments made during the ramp up period are about 10° C. Thus, the inherent inaccuracy of the thermocouple for this fine of a temperature change also adds instability to the system. These instabilities increase the likelihood that the thickness of the deposited layer will not be within acceptable limits and the wafer will require rework.

The present invention is directed to overcoming, or at least reducing the effects of, one or more of the problems set forth above.

SUMMARY OF THE INVENTION

One aspect of the present invention is seen in a processing line including a processing tool and an automatic process controller. The processing tool is adapted to deposit a layer of material on a semiconductor wafer based on an operating recipe. The automatic process controller is adapted to identify a post-idle set of wafers to be processed in the processing tool after an idle period, determine deposition times for wafers in the set of post-idle wafers, and modify the operating recipe of the processing tool for each of the wafers in the post-idle set based on the deposition times.

Another aspect of the present invention is seen in a method for reducing wafer to wafer deposition variation. The method includes designating a set of post-idle wafers; determining a deposition time for each of the wafers in the post-idle set, at least two of the deposition times being different; and depositing a layer on the wafers in the post-idle set based on the deposition times determined.

BRIEF DESCRIPTION OF THE DRAWINGS

The invention may be understood by reference to the following description taken in conjunction with the accompanying drawings, in which like reference numerals identify like elements, and in which.

Figure 1:
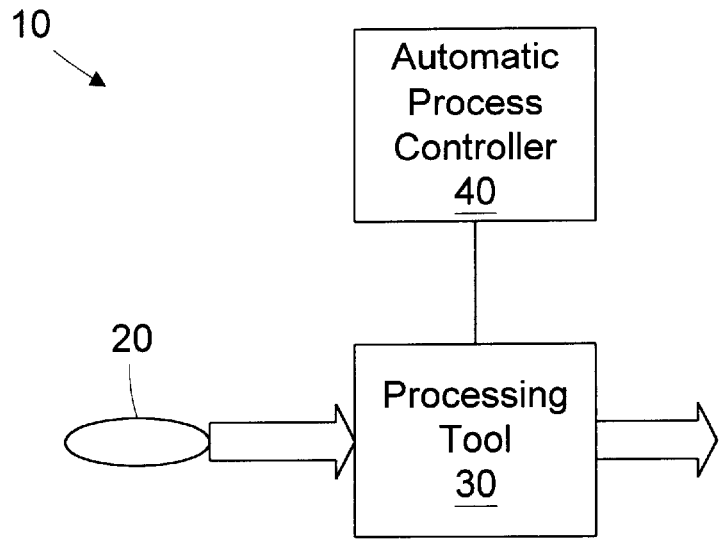
FIG. 1 is a simplified block diagram of a processing system in accordance with the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Referring now to the figures, and in particular, to FIG. 1, a simplified diagram of a processing line 10 for processing wafers 20 in accordance with the present invention is provided. The processing line 10 includes a processing tool 30, and an automatic process controller 40. The automatic process controller 40 interfaces with the processing tool 30 for modifying operating parameters of the processing tool 30 based on a manual or an automatic input. In the illustrated embodiment, the processing tool 30 is a plasma enhanced chemical vapor deposition (PECVD) tool useful for depositing layers on the semiconductor wafer 20. A suitable PECVD tool is a Concept 2 Dual Sequel Express tool sold by Novellus Systems. Although the invention is described as it may be implemented in a PECVD tool, the concepts described herein may be applied to various other processing tools used for forming a variety of process layers.

Figure 2:
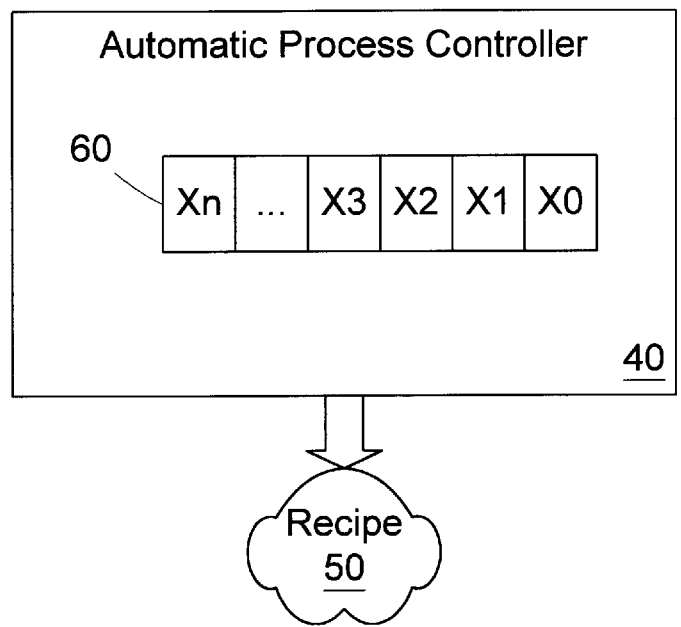
FIG. 2 is a simplified block diagram of an automatic process controller interfacing with an operating recipe of a processing tool in the processing system of FIG. 1.

Turning now to FIG. 2, a simplified block diagram of the automatic process controller 40 interfacing with an operating recipe 50 of the processing tool 30 is provided. The automatic process controller 40 includes an offset table 60 that stores deposition times (X0 to Xn) for a number of wafers 20 processed after an idle state, referred to as a post-idle set of wafers. The normal deposition time for the processing tool 30 under steady state conditions is represented by X0. The deposition times for the N wafers 20 processed after the idle time are represented by X1 through Xn. After the $N^{th}$ wafer 20 has been processed, the automatic process controller 40 sets the deposition time in the recipe 50 to the X0 value. The temperature parameters (e.g., starting temperature and ramp rate) remain at the normal operating parameters for the processing tool 30.

The particular number of wafers 20 in the post-idle set may be fixed, or alternatively, the number may be based on the idle time. For example, a longer idle time may result in a larger number of wafers 20 in the post-idle set.

In the illustrated embodiment, the automatic process controller 40 is a computer programmed with software to implement the functions described. However, as will be appreciated by those of ordinary skill in the art, a hardware controller designed to implement the particular functions may also be used. Portions of the invention and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the action and processes of a computer system, or similar electronic computing device, that manipulates and transforms data represented as physical, electronic quantities within the computer system's registers and memories into other data similarly represented as physical quantities within the computer system memories or registers, or other such information storage, transmission or display devices.

The automatic process controller 40 receives an idle time input, either manually from an operator or automatically from monitoring the processing tool 30. Based on the idle time, the automatic process controller 40 determines deposition times for a predetermined number of wafers 20 processed after the idle time. The number of wafers 20 and the amount of change in the deposition time are application dependent, and may be determined empirically or theoretically.

Alternatively, the automatic process controller 40 may be configured to use predetermined deposition times in the offset table 60 independent of the idle time. For example, the automatic process controller 40 may only implement the deposition time control after cleanings of the processing tool 30, and not after other idle times. As such, the deposition times would be generally be the same for each ramp up period.

In one embodiment, the deposition times are linear, where the slope and/or intercept of the line are dependent on the idle time. In another embodiment, the deposition time of the first wafer in the post-idle set may be linearly based on the idle time, and the remaining deposition times may be determined basic on a non-linear model.

For illustrative purposes, a sample algorithm for determining the deposition times after a preventative maintenance cleaning is now described. The illustrative example uses a post-wafer set size of ten wafers. Initially, test wafers are processed using the default deposition time specified in the recipe of the processing tool 30. Slots 1, 5, and 10 are filled with test wafers, and the remaining slots receive dummy wafers. More test wafers may be used if desired. The thicknesses of the layers deposited on the test wafers and the associated standard deviation are measured. A least square approximation is calculated to fit the measurements to a linear equation. The equation is:

$$Y(i) = M*X(i) + C \tag{1}$$

where Y(i) is the thickness of the deposited layer for slot i, X(i) is the slot number, and M and C are slope and offset coefficients determined by the least square approximation.

The deposition time offset (i.e., the difference between the default deposition time and the determined deposition time) is then calculated using the equation:

$$T(i) = [Y(10) - Y(i)]/[Y(i)/\text{Default Deposition Time}] \tag{2}$$

Periodically, feedback measurements may be taken to improve the accuracy of the offset equation. For example, if the difference between the layer thicknesses of the tenth and first wafers processes in accordance with the determined deposition times is greater than a predetermined threshold (e.g., 200 Angstroms), the least square approximation may be repeated to tune the parameters of Equation 1.

Figure 3:
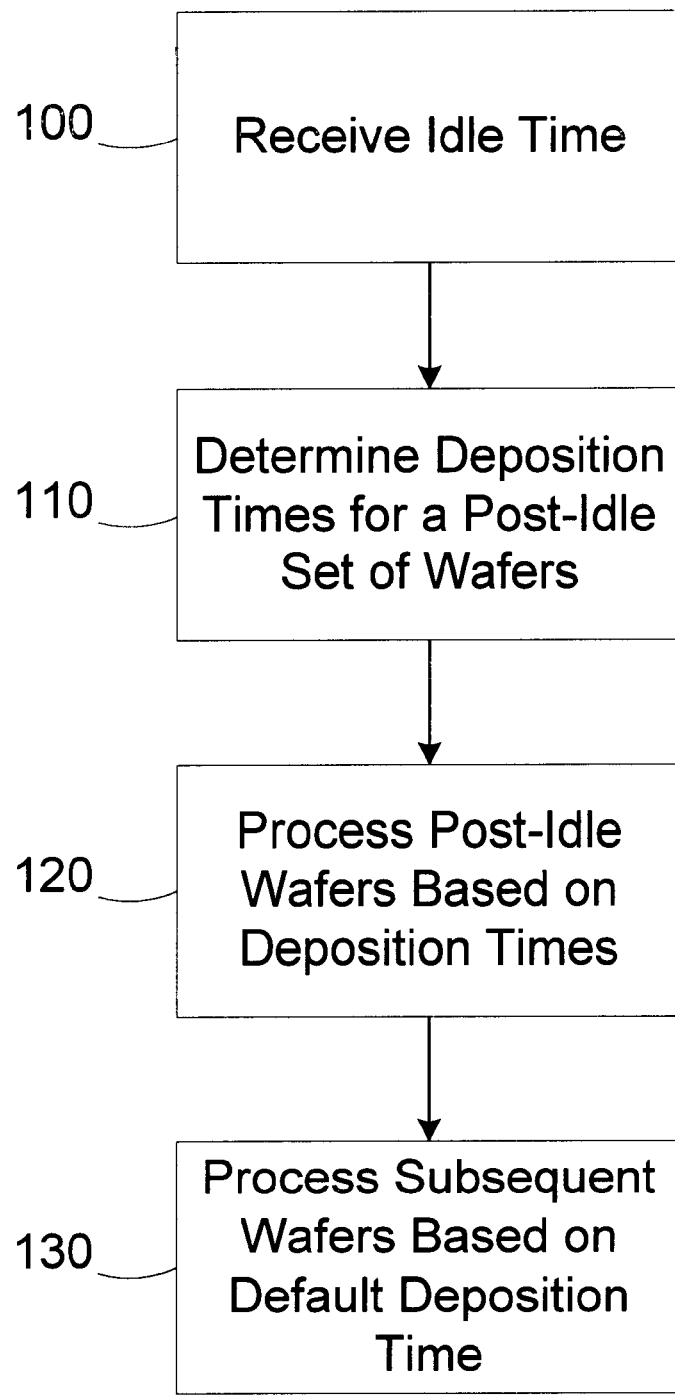
FIG. 3 is a flow diagram of a method for reducing wafer to wafer deposition variation in accordance with the present invention.

Referring now to FIG. 3, a flow diagram of a method for reducing wafer to wafer deposition variation in accordance with the present invention is provided. In block 100, a tool idle time is received (i.e., based on either manual or automatic input). Deposition times are determined for a set of post-idle wafers based on the idle time in block 110. The number of wafers in the post-idle set may be a predetermined number or alternatively, the number may be also based on the idle time. The wafers 20 are processed in a processing tool based on their associated deposition times in block 120. Subsequent wafers are processed using a default deposition time in block 130.

Controlling the deposition time in accordance with the present invention has numerous advantages over controlling the temperature to account for deposition rate variations during the ramp up after an idle condition. For example, in the illustrated embodiment, the deposition time may be controlled with an accuracy of about ±20 milliseconds, a much finer degree of control than possible with temperature adjustments.

Information from the automatic process controller 40 may also be used to diagnose problems with the processing tool 30. As described above, as the processing tool 30 is used to process wafers, material gradually builds up on the internal surfaces resulting in a change in the deposition rate. The processing tool 30 may be cleaned in response to identifying these conditions. Because the prior art technique varies the temperature, and thus the deposition rate, during the ramp up interval, it is difficult to discern whether fluctuations in the deposition rate are caused by improper temperature changes or material build up. Adjusting the deposition time, as described herein, does not affect the deposition rate, and thus, a problem with the processing tool 30 may be identified during the ramp up period if the deposition thicknesses do not correspond to expected thicknesses. Such an occurrence may result if the predicted operating period for the processing tool 30 (ie., interval between preventative maintenance cleanings) is incorrect.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A processing line, comprising:
   a processing tool adapted to deposit a layer of material on a semiconductor wafer based on an operating recipe including a default deposition time specifying a length of time for depositing the layer; and
   an automatic process controller adapted to identify a post-idle set of wafers to be processed in the processing tool after an idle period, determine deposition times for individual wafers in the set of post-idle wafers based on the length of the idle period, and modify the operating recipe of the processing tool for each of the wafers in the post-idle set based on the determined deposition times, the determined deposition times being different than the default deposition time.

2. The processing line of claim 1, wherein the automatic process controller is adapted to determine the number of wafers in the post-idle set based on an amount of time that the processing tool has been idle.

3. The processing line of claim 2, wherein the automatic process controller is adapted to determine the deposition times in a linear manner based on the idle time.

4. The processing line of claim 1, wherein the automatic process controller is adapted to determine the number of wafers in the post-idle set based on an amount of time that the processing tool has been idle.

5. The processing line of claim 1, wherein the automatic process controller includes an offset table, each entry in the offset table representing the deposition time for one of the wafers in the post-idle set.

6. The processing line of claim 5, wherein the offset table includes a default deposition time, and the automatic process controller is adapted to modify the operating recipe of the processing tool based on the default deposition time for wafers processed subsequent to the post-idle set.

7. The processing line of claim 1, wherein the operating recipe includes a starting temperature and a ramp rate that do not change during processing of the wafers in the post-idle set.

8. The processing line method of claim 1, wherein the post-idle set of wafers includes a predetermined number of wafers.

9. A method for reducing wafer to wafer deposition variation, comprising:
   specifying a default deposition time for depositing a process layer in a processing tool;
   designating a set of post-idle wafers after the processing tool has experienced an idle period;
   determining an individual deposition time for each of the wafers in the post-idle set based on the length of the idle period, the determined deposition times being different than the default deposition time; and
   depositing a layer on the wafers in the post-idle set based on the determined deposition times.

10. The method of claim 9, wherein determining the deposition times includes determining the deposition times based on an amount of time that the processing tool has been idle.

11. The method of claim 10, wherein determining the deposition times includes determining the deposition times in a linear manner based on the idle time.

12. The method of claim 9, wherein designating the post-idle set of wafers includes determining the number of wafers in the post-idle set based on an amount of time that the processing tool has been idle.

13. The method of claim 9, further comprising storing wherein the deposition times for the wafers in the post-idle set in an offset table.

14. The method of claim 13, wherein the offset table includes a default deposition time, and the method further comprises depositing a layer on wafers subsequent to the post-idle set based on the default deposition time.

15. The method of claim 9, wherein depositing the layer on the wafers in the post-idle set includes maintaining a starting temperature and a ramp rate that do not change during processing of the wafers in the post-idle set.

16. The method of claim 9, further comprising modifying an operating recipe of a tool used to deposit the layer on the wafers in the post-idle set based on the deposition times.

17. The method of claim 9, further comprising modifying an operating recipe of a tool used to deposit a layer on wafers subsequent to the wafers in the post-idle set based on a default deposition times.

18. The method of claim 9, wherein designating the post-idle set of wafers includes identifying the post-idle set having a predetermined number of wafers.

* * * * *

UNITED STATES PATENT AND TRADEMARK OFFICE
CERTIFICATE OF CORRECTION

PATENT NO.     : 6,417,014 B1
DATED          : July 9, 2002
INVENTOR(S)    : Lam et al.

It is certified that error appears in the above-identified patent and that said Letters Patent is hereby corrected as shown below:

Column 1,
Line 67, delete "number of wafers in the post-idle set" and insert -- deposition times --

Signed and Sealed this

Twenty-ninth Day of October, 2002

Attest:

JAMES E. ROGAN
Attesting Officer       Director of the United States Patent and Trademark Office